ELECTRICAL ISOLATION MEANS FCR COMPONENTS ON
A PRINTED CIRCUIT BOARD

Filed Jan. 4, 1965

BOTTOM VIEW OF CIRCUIT BOARD

VIEW OF METHOD TO LOCATE ISOLATION POINTS ON SCHEMATIC

INVENTOR
PAUL E. FALER

BY Thomas A. Brody

HIS ATTORNEY

United States Patent Office 3,296,360

Patented Jan. 3, 1967

3,296,360
ELECTRICAL ISOLATION MEANS FOR COMPONENTS ON A PRINTED CIRCUIT BOARD

Paul E. Faler, Decatur, Ill., assignor to General Electric Company, a corporation of New York Filed Jan. 4, 1965, Ser. No. 423,166
3 Claims. (Cl. 174—68.5)

Figure 1:
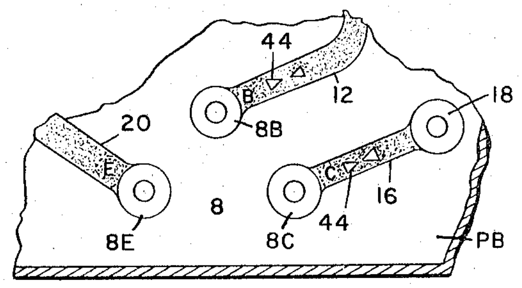

This invention relates to printed circuit boards for the simplified connection and assemblage of electronic components, and more particularly to an improved arrangement for enhancing the serviceability of printed circuit boards involving transistors or the like.

An often neglected aspect with regard to the modern-day design and manufacture of electronic circuitry, is the aspect of serviceability. For example, in analyzing a series of presently manufactured transistorized amplifiers, it has been found that the transistors and other electronic components of these amplifiers are often connected together by means of a rather intricate pattern of a printed circuit board. Little if any, attention is usually given in designing these printed circuit boards, to the aspect of serviceability. Thus, in many prior art printed circuit boards for transistors, the solder side of the board constitutes a virtually unidentifiable jungle of lines and patterns wherein the transistors and other electronic components are soldered. Such arrangements provide considerable difficulty in locating the transistors and their connections for servicing. Such prior art approaches have also generally required much difficulty in isolating connections to the transistors and then restoring the board to satisfactorily operable condition. It has, therefore, been found desirable to provide an improved printed circuit board which overcomes these shortcomings.

An important object of my invention is to provide an improved printed circuit board which is readily serviceable.

Another object of my invention is to provide an improved means for electrically trouble-shooting a transistorized printed circuit board, which means is simplified and economical in cost.

An additional object of my invention is to provide an improved means for locating an isolation point for a transistor electrode on a printed circuit board.

A further object of my invention is to provide an improved readily identifiable, readily severable and readily restorable isolation point for a printed circuit board.

In accordance with one form of my invention, I have provided a printed circuit board for a transistorized amplifier. This printed circuit board includes a pattern of conductive material which electrically connects together a plurality of electronic components, at least one of which is a transistor. The transistor includes an emitter electrode, a collector electrode, and a base electrode, which are connected into the conductive pattern of the printed circuit board. With such an arrangement, my invention provides a readily identifiable, readily severable and readily solderable means located closely adjacent to and associated with each of the collector and base electrodes. Each solderable means superimposes a portion of the printed circuit board pattern connected to its associated transistor electrode, thereby to identify and facilitate the electrical isolation of the transistor electrode from the printed circuit board. Such an approach thus makes it easier for the serviceman to identify the transistor isolation points for the board, to isolate these points from the board, and to electrically restore the board into effective operability.

Figure 2:
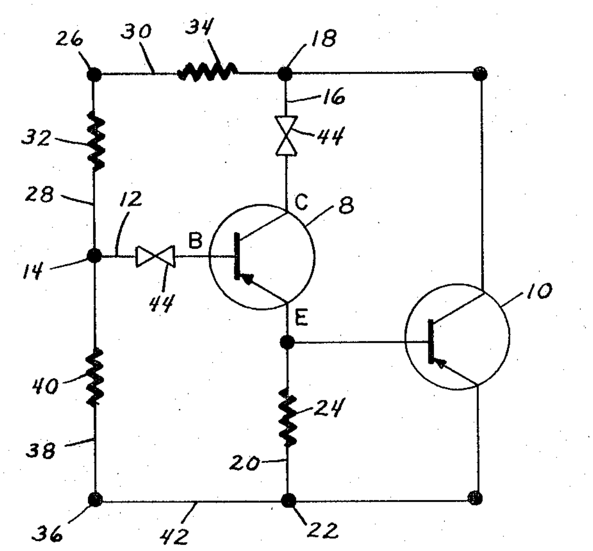

Further aspects of my invention will become apparent hereinafter from the following description, the claims appended thereto, and the accompanying drawing, in which:

FIGURE 1 is a fragmentary perspective view of a printed circuit board for a transistorized amplifier, embodying one form of my invention; and FIGURE 2 is a schematic diagram of a portion of a transistorized amplifier circuit which embodies my invention in the form described by FIGURE 1.

Referring now to the drawing for a detailed explanation of the present invention, attention is initially directed to FIG. 2. As shown therein in schematic fashion, transistor 8 forms part of the circuit of a transistorized amplifier. The illustrated transistor 8 includes the conventional base electrode B, collector electrode C, and emitter electrode E, and forms part of a single transistor amplifier stage which might appear on the solder side of a printed circuit board. The particular schematic portion of the transistorized amplifier also includes conductive path 12 which is connected from the base electrode B to point 14, conductive path 16 which is connected from collector electrode C to point 18, and conductive path 20 which connects emitter electrode E to point 22 through resistor 24. As further shown in FIG. 2, points 14 and 18 are connected to one side of the circuit at point 26, via conductive paths 28 and 30, which include respectively the resistors 32, 34. Point 14 is also joined to the other side of the circuit at point 36 via conductive path 38 which includes resistor 40. Point 22 is connected to point 36 via conductive path 42.

The schematic portion of a transistor amplifier as shown in FIG. 2 is presented to furnish a background for understanding the mode of utilization of my invention. Whenever a plurality of transistors such as transistors 8 and 10 are coupled in a circuit (such as, for example, by D.C. coupling), it often becomes desirable for servicing purposes, to electrically isolate one or more of these transistors from the remainder of the circuit. In accordance with the present invention, a simplified means is provided for rapidly opening these transistor circuits to facilitate convenient meter analysis.

To effectively enable the serviceman to electrically isolate a transistor on a printed circuit board without unsoldering components or transistors, a special symbol has been selected which is readily recognizable and immediately identifies the isolation point. This symbol resembles and may be termed for reference purposes a "bow-tie" 44, since it involves a solder pattern of electrically conductive material resembling two triangles with an apex of each triangle in contiguity to an apex of the other triangle. As illustrated in FIG. 2, a bow-tie pattern 44 of solder is superimposed upon conductive path 12 which leads toward point 14 from base electrode B, and a bow-tie pattern 44 of solder is also superimposed upon conductive path 16 which leads toward point 18 from the collector electrode C.

Turing now to FIG. 1, there is illustrated a portion of a printed circuit board PB wherein the transistor 8 is to be connected in accordance with my invention. As shown therein, the numeral "8" is located on the board at the physical center of a triad formed by the solder pads 8B, 8C and 8E of the transistor 8. In addition, the letters "B," "C," and "E" are physically located, respectively, on the conductive paths 12, 16, and 20 near the respective transistor solder pads 8B, 8C and 8E. The purpose of this procedure is to leave no question whatsoever in the serviceman's mind as to the identity of the transistor involved and the location of its associated base, collector, and emitter electrodes.

As further shown in FIG. 1, the bow-tie solder patterns 44 are superimposed on the conductive paths 12 and 16 and each of these patterns is located adjacent one of the transistor solder pads 8B and 8C. This symbol is completely unlike any conventional solder pads and copper patterns, and it may be included in the anti-solder mask so that, in the finished circuit board, solder in the bow-tie configuration adheres to the conductive pattern (e.g. copper). The bow-tie solder patterns 44 may thus be produced on the circuit board during the production soldering operation.

When the serviceman desires to electrically isolate transistor 8 (assuming that the transistor 8 has been connected to its solder pads 8B, 8C, and 8E from the side of the board PB (not shown), all that he needs to do is sever the conductive patterns in transverse fashion between the apexes of the superimposed bow-tie solder patterns 44. This operation may be achieved in very simplified fashion by using a knife, a razor blade, or even a screwdriver, and moving the tool at right angles relative to the direction of the conductive paths at the center of the bow-tie 44. It will thus be seen that transistor 8 may be readily electrically isolated at the points indicated by the bow-tie solder paterns 44 in FIGS. 1 and 2.

After the transistor 8 has been electrically isolated, restoring its connection to the amplifier circuit is a very simple procedure. Thus, after trouble-shooting has been completed, all the serviceman needs to do is apply a soldering iron to the bow-tie pattern 44. Solder thereupon flows together at the apexes of the two segments of the bow-tie pattern to restore an electrical connection to each transistor electrode which has been isolated.

It will now, therefore, be seen that my new and improved isolation means for a printed circuit board is simplified, efficient, and economical in cost. It will be further realized that printed circuit boards incorporating my invention make the servicing of the boards much more convenient for the technician or serviceman, particularly with respect to printed circuit boards involving semiconductors.

While in accordance with the patent statutes, I have described what at present is considered to be the preferred embodiment of my invention, it will be obvious to those skilled in the art that various changes and modifications may be made therein without departing from the invention and I, therefore, aim in the following claims to cover all such equivalent variations as fall within the true spirit and scope of the invention.

What I claim as new and desire to secure by Letters Patent of the United States is:

1. In a printed circuit board including a pattern of conductive material and at least one device having a plurality of electrodes connected to said conductive pattern, means for electrically isolating at least one of said electrodes from said pattern, said means comprising a body of normally solid solder located on said pattern adjacent said one electrode, said solder of said body being electrically conductive, said body having a characteristic readily identifiable shape thereby to indicate the location of said isolating means, said body comprising a pair of closely adjacent readily connectable electrically conductive segments to form a connection between said electrode and said pattern after its disconnection therefrom at said isolation means.

2. In a printed circuit board including a pattern of conductive material and at least one semiconductor device having a plurality of electrodes connected to said conductive pattern, means for electrically isolating at least one of said electrodes from said pattern, said means comprising a body of normally solid solder located in superimposed relationship on said pattern adjacent said one electrode, said solder of said body being electrically conductive, said body having a characteristic readily identifiable shape comprising a pair of electrically conductive segments, each one of said segments having a point disposed in contiguity to a point of the other segment, said conductive pattern being readily severable between the points of said segments thereby to isolate said one electrode, said segments being readily connectable by fusing said segments together, forming a connection between said one electrode and said pattern after its disconnection therefrom.

3. The printed circuit board and electrical isolation means of claim 2 wherein the solder of the electrical isolation means has the general configuration of a bow-tie.

References Cited by the Examiner

UNITED STATES PATENTS 2,909,833 10/1959 Murray et al.

FOREIGN PATENTS 867,090 3/1961 Great Britain.

OTHER REFERENCES

Williers et al., German application No. 1,126,463, March 1962.

LEWIS H. MYERS, *Primary Examiner.*

DARRELL L. CLAY, *Examiner.*